United States Patent [19]

Kaczynski et al.

[11] Patent Number: 4,871,290

[45] Date of Patent: Oct. 3, 1989

[54] AUTOMATIC HANDLING APPARATUS FOR PLATE-SHAPED OBJECTS

[75] Inventors: Ulrich Kaczynski, Bad Nauheim; Peter Schmidt, Huettenberg; Hans-Helmut Paul, Wetzlar, all of Fed. Rep. of Germany

[73] Assignee: Ernst Leitz Wetzlar GmbH, Wetzlar, Fed. Rep. of Germany

[21] Appl. No.: 194,224

[22] Filed: May 16, 1988

[30] Foreign Application Priority Data

May 17, 1987 [DE] Fed. Rep. of Germany ....... 3716549

[51] Int. Cl.$^4$ ............................................. H01L 21/68
[52] U.S. Cl. .................................... 414/331; 414/223; 414/274; 414/416; 414/749; 414/744.3; 901/30
[58] Field of Search ........... 414/222, 225, 331, 744 R, 414/774 A, 749, 751, 416, 274, 217, 223, 226; 901/30, 31, 41; 29/33 P, 563, 568

[56] References Cited

U.S. PATENT DOCUMENTS

| | | |
|---|---|---|
| 3,731,823 | 5/1973 | Goth . |
| 3,780,423 | 12/1973 | Lilienthal et al. .............. 414/749 X |
| 3,851,972 | 12/1974 | Smith et al. ..................... 414/416 X |
| 3,951,271 | 4/1976 | Mette .............................. 414/744 X |
| 4,309,809 | 1/1982 | Yokoe et al. ..................... 901/30 X |
| 4,501,527 | 2/1985 | Jacoby et al. ...................... 414/225 |
| 4,514,130 | 4/1985 | Gladish ............................... 414/416 |
| 4,587,716 | 5/1986 | Bytow ................................. 29/568 |
| 4,596,066 | 6/1986 | Inoue .................................. 29/568 |
| 4,614,474 | 9/1986 | Sudo ............................... 414/331 X |
| 4,621,410 | 11/1986 | Williamson ......................... 29/568 |
| 4,651,863 | 3/1987 | Reuter et al. .................. 414/416 X |
| 4,678,390 | 7/1987 | Bonneton et al. .............. 414/331 X |
| 4,685,850 | 8/1987 | Ohta et al. ..................... 414/223 X |
| 4,687,542 | 8/1987 | Davis et al. .................... 414/222 X |
| 4,695,215 | 9/1987 | Jacoby et al. ....................... 414/225 |

FOREIGN PATENT DOCUMENTS 3714045 11/1987 Fed. Rep. of Germany .

Primary Examiner—Robert J. Spar
Assistant Examiner—Robert S. Katz
Attorney, Agent, or Firm—Foley & Lardner, Schwartz, Jeffery, Schwaab, Mack, Blumenthal & Evans

[57] ABSTRACT

An automatic handling apparatus for plate-shaped objects, including a height-adjustable magazine having compartments lying horizontally, one above the other, and a manipulator which can be moved in a linear manner and is swivelable. The manipulator is equipped with interchangeable gripping arms. The gripping arms and the plate-shaped objects are deposited in compartments of the magazine. The compartments include a coding for the size and shape of the plate-shaped objected and the associated gripping arms. A control device controls the manipulator as a function of the coding of the plate-shaped object or gripping arm to be handled.

9 Claims, 2 Drawing Sheets

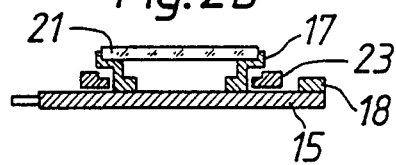
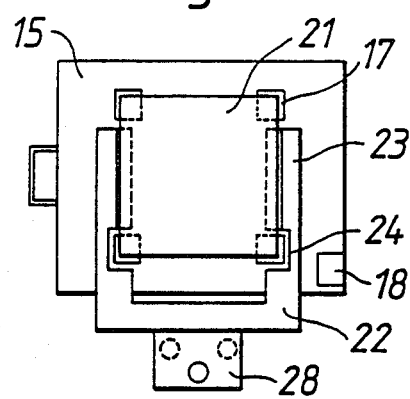
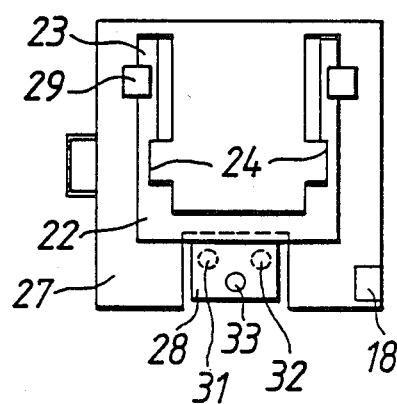
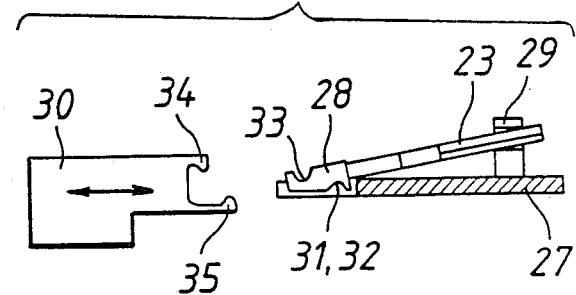

AUTOMATIC HANDLING APPARATUS FOR PLATE-SHAPED OBJECTS

BACKGROUND OF THE INVENTION

The invention relates to an automatic handling apparatus for plate-shaped objects.

An apparatus of this kind is known from DE-PS No. 3,219,502. A number of wafers of the same size and shape are located in the magazine. The wafer sizes are standardized, with the result that a small number of magazine types is sufficient. Insofar as wafers have to be handled automatically during the production process, it is always a question of a relatively large number of objects of the same kind. It thus makes economic sense to use specific exchangeable types of magazines which can be introduced in the loaded condition into air-conditioned chambers and ultraclean rooms, e.g., via locks.

For the examinations of samples it is necessary to have freely selectable access to the wafers. This is achieved by a special design of the gripping arm on the manipulator. Since the wafers are relatively light, a vacuum pick-up has become established for the gripping arm. The linearly movable manipulator having a gripping arm forms a functional unit.

The masks used for the exposure operations are of decisive importance in the production of the patterns on the wafers. Extreme requirements are imposed on the dimensional accuracy and intactness of the mask fields. As a rule, stable, and hence, relatively heavy glass plates produced from a glass having a very small coefficient of expansion are used as mask carriers. Each mask carrier is stored and transported in a special cassette. The mask carrier is removed from this cassette manually when required and placed at the location of use. Because of the sensitivity of the mask fields, the mask may only be gripped in the edge region.

The increasing fineness of semiconductor patterns makes even greater demands on the equipment for measuring and checking the patterns. The most modern mask measuring machine achieves a measuring accuracy in the nanometer range. In this measurement range even slight temperature gradients by reason of manual contact with the heat of the body lead to measurement errors. Since the measuring machines are set up in an air-conditioned chamber. A certain period of time must first of all be spent waiting for the mask carriers which have been introduced to achieve temperature equalization before measuring is begun.

An acceleration of this procedure is conceivable if loading is carried out using appropriately temperature-regulated gripping tools. In each case, the loading of the measuring machine requires the presence of an operator, since to date there is still a relatively large variety of types of mask carriers, making individual handling of each individual disk necessary. Different measuring times for the individual samples furthermore make necessary additional attentiveness on the part of the operative.

SUMMARY OF THE INVENTION

An object of this invention is, therefore, to provide an automatic handling apparatus, using plate-shaped objects of various sizes and shapes which can be stored and fed to a measuring or processing machine while allowing freely selectable access. The automatic apparatus should be capable of working under clean room conditions and in an air-conditioned chamber.

This object is achieved according to the invention by providing an automatic handling apparatus for plate-shaped objects including a height adjustable magazine having compartments lying horizontally, one above the other, and a swivelable manipulator, also movable in a linear manner. The manipulator is equipped with interchangeable gripping arms. The gripping arms and the plate-shaped objects are deposited in compartments in the magazine. The compartments include a coding for the size and shape of the plate-shaped objects and the associated gripping arms. A control device controls the manipulator as a function of the coding of the plate-shaped object or gripping arm to be handled.

BRIEF DESCRIPTION OF THE DRAWINGS

The invention is described below with reference to a schematically represented exemplary embodiment. In particular.

FIGS. 2a, 2b show a pallet loaded with a rectangular object;

FIG. 3 shows a pallet loaded with a round object;

FIG. 4 shows a pallet loaded with a gripping arm;

FIG. 5 shows a gripping arm and the coupling piece of the manipulator in cross-section.

DETAILED DESCRIPTION OF THE PREFERRED EMBODIMENTS

Figure 1:
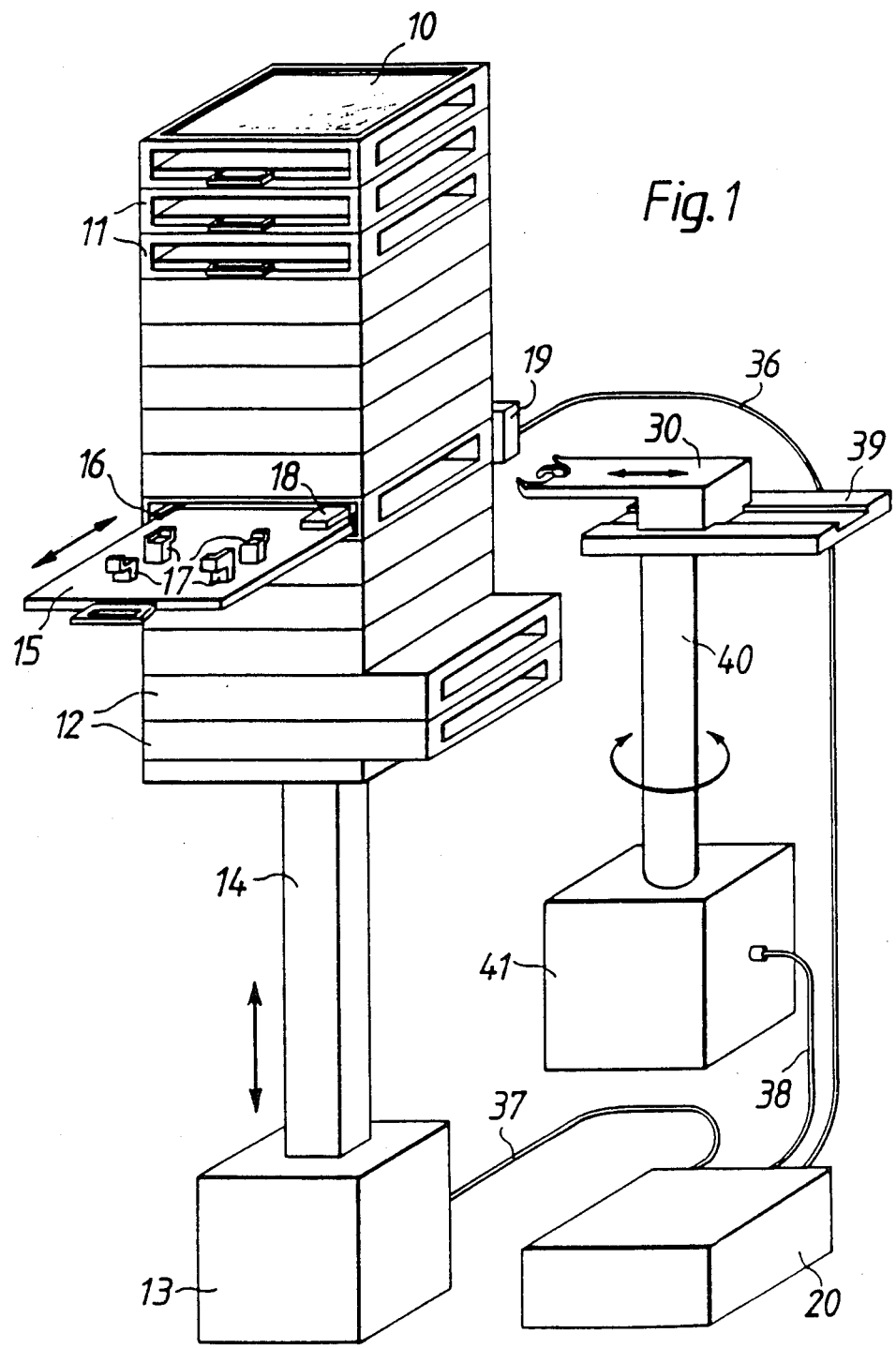
FIG. 1 shows an assembly of the elements of the automatic handling apparatus.

FIG. 1 shows a magazine 10 having a plurality of compartments 11, lying one above the other, for plate-shaped objects, such as, for example, mask carriers, and compartments 12 for accommodating various gripping arms. The entire magazine can be height-adjusted by means of a motor 13 having a lifting rod 14.

For one of the compartments 11 a pallet 15 is shown which can be slid into the compartment in a lateral guide 16 in the compartment wall. It is advantageous if the compartments have solid base plates to prevent parts worn away by abrasion or any contaminants on the pallets from falling through into the compartment underneath.

Supporting blocks 17, the design of which is described in greater detail with reference to FIGS. 2 and 3, are provided on the pallet 15. Their position can be matched to the particular objects to be received.

In addition, there is a coding on the rear side of the pallet 15, this coding being represented symbolically by a box 18. In this embodiment, it can be any kind of optically, electrically, mechanically or optoelectronically readable code. The latter carries the information on the size and shape of the particular object deposited on the pallet in coded form. With the pallet inserted, it is decoded by a code reader 19 and passed to the control device 20.

The pallets 15 are exchangeable. They can be individualized for particular objects by the position and arrangement of the supporting blocks 17. Their identity is incorporated in the coding. It is possible to distinguish between a plurality of pallets of the same kind by numbering the compartments. In the simplest case, each compartment can be allocated its own code reader, which passes the compartment number and the code of the pallet inserted to the control device. However, it is also sufficient to provide a single code reader 19 only, the individual compartments passing the latter one after the other by virtue of the height adjustment of the magazine 10 so that it is likewise possible, by counting off the compartments, to identify unambiguously their individual contents. The contents of the compartments 11, having been recognized by the code reader 19, can be entered in a memory (not shown in greater detail) in the control device 20 via a signal line 36.

In the exemplary embodiment, the dimensions of the compartments 12 are somewhat larger than those of the compartments 11. As will be explained with reference to FIG. 4, the pallets required for accommodating the gripping arms have a correspondingly larger surface area. Since the pallets to be pushed into the compartments 12 are also exchangeable in the same way as the pallets 15, they cannot be confused with the latter because of their different size.

Before the operating sequence of the automatic handling apparatus is described in greater detail, the mounting of the objects on the pallets 15 will be explained with reference to FIGS. 2 to 4.

In FIG. 2a, a square shaped plate 21 is mounted on the pallet 15. It is held by four blocks 17 which form only a small supporting surface in the edge region of the plate 21.

The supporting surfaces of the blocks have an edge raised at an angle so that the plate 21 is secured against sliding in the event of a jolt against the pallet 15.

The raised edge of the supporting surfaces can be seen in FIG. 2b. It is furthermore clear from this figure that the plate 21 is spaced from the pallet 15. The view represented is that of the loaded pallet in the removal direction. It is important here that the blocks are cut away inwards in a U-shape underneath the supporting surface. The gripping arm 22, which is likewise represented in FIG. 2a and is designed as a fork, is pushed into this cutout.

The illustrated shaping of the supporting blocks ensures that the gripping arm 22 can be pushed under an edge region of the plate 21 without touching this plate 21.

To remove the plate 21, said plate must be raised above its jolt-protected position. In order that the gripping arm 22 does not collide with the supporting surfaces during this operation, the two fork parts 23 have a U-shaped cutout 24 at this location. The supporting surface for the plate 21 on the fork parts 23 is arranged somewhat lower, so that the plate 21 is also secured against lateral sliding on the gripping arm 22.

In FIG. 3, a round plate 25 is illustrated as a further example. Three supporting blocks 26 having raised edges are sufficient for carrying it in a jolt-protected manner. When the fork parts 23 of the gripping arm 22 are pushed under the plate 25, they are not obstructed by the supporting blocks. Both the blocks 26 and the fork parts 23 can therefore be of simpler design.

FIG. 4 shows a pallet 27 suitable for accommodating a gripping arm 22, as already illustrated, for example, in FIG. 2a. Because of the coupling means 28 connected to the gripping arm 22, this pallet must be somewhat larger than the pallets 15. The gripping arm 22 is held on the pallet 27 by pushing the fork parts 23 into, for example, U-shaped holding elements 29. In the region of the coupling means 28, the pallet 27 has a recess, allowing a corresponding counterpart on the manipulator to engage unhindered in the coupling 28.

It can be seen from FIG. 5 how a simple coupling can be produced between gripping arm 22 and manipulator 30. The coupling means 28 attached to the gripping arm 22 has a mounting 33 on the upper side and two mountings 31, 32 offset in relation thereto on the underside in the form of depressions. Corresponding counterparts 34, 35 are provided on the manipulator. The gripping arm 22 is held in an inclined position with respect to the pallet 27 by the holding element 29.

To accommodate the gripping arm, the manipulator 30 is pushed by its coupling piece over the coupling means 28. By lowering the magazine 10 and thus also the pallet 27, the mountings 31, 32 first of all engage with the counterpart 35. On further lowering, the gripping arm pivots about this mounting by reason of the conditions of leverage until the mounting 33 too is in engagement with the counterpart 34. In this position, the supporting surfaces on the fork parts 23 are horizontal and the gripping arm can be removed from the pallet 27 without hindrance by retracting the manipulator 30 and, after appropriate control, moved under one of the plate shaped objects 21, 25 to be measured in order to remove this too.

The functional sequence of the automatic handling apparatus will be presented once more in summary with reference to FIG. 1 and the particular advantages of the new apparatus also emerge.

The compact overall construction also makes possible its accommodation in an air-conditioned box. A slot shaped opening which can be closed and faces one compartment of the magazine can be provided in the wall of a box of this kind. The individual compartments can be loaded one after the other through this opening by moving the magazine past the opening within the box.

The pallets can be prepared outside, it being possible to use special tools for loading and prior temperature adjustment also being possible. The mounting means may, in addition, be adjusted to accommodate different sized plate shape objects. Such adjustments are conventional in this art. This means a rationalization in work preparation.

In accordance with the mask disks loaded, the associated gripping arms are then to be laid on the corresponding pallets and pushed into the compartments 12. The automatic apparatus knows in which compartment which object is located and where the associated gripping arm is to be found by means of the code reader 19 and a memory associated with the control device 20, this memory being connected to the code reader 19 via a signal line 36. In accordance with a preset program and via signal lines 37, 38, the control device 20, then commands the servomotor 13 for the magazine 10 to bring the desired compartments into the removal position opposite the manipulator 30 and furthermore controls the manipulator 30. The latter is displaceable in a linear manner in a guide track 39. The guide track 39 is attached to a rotatable axle 40. Both movements are driven by a motor 41. During pivoting in the loaded condition, the manipulator is preferably displaced in the guide track 39 such that the mask disk lies above the axis of rotation so as to keep the acceleration forces acting on the mask disk as low as possible.

The modular construction of the automatic handling apparatus makes it possible to attach the magazine to any desired lifting system of known design. At the same time, attachment can also be effected at the magazine wall which is not required for loading or access to the objects. The magazine walls are furthermore to be of largely open design to facilitate uniform air-conditioning of all compartments. The number of compartments can easily be matched to what is needed.

Any desired system of known design can be selected for the manipulator system since only the coupling means between manipulator and gripping arm have to be matched to one another.

What is claimed is:

1. A handling apparatus for plate shaped objects, comprising:
    a magazine having horizontal compartments arranged one above the other;
    means for adjusting the height of the magazine;
    a manipulator capable of linear and swiveling motion;
    a plurality of gripping arms, each being engageable by the manipulator;
    object engaging means on each gripping arm, the engaging means having varying sizes and shapes adapted to the sizes and shapes of the plate shaped objects;
    coding means for each compartment, the coding means indicating the contents of the compartment, the magazine having compartments adapted both for the storage of plate shaped objects and for the storage of gripping arms;
    reading means for sensing the information provided by the coding means, the reading means being fixed in height; and;
    control means responsive both to the reading means and to inputted information designating a desired plate shaped object or gripping arm to be handled, the control means causing the height adjusting means to horizontally align the appropriate compartment with the manipulator to effect the handling of the designated object or gripping arm.

2. The apparatus of claim 1, further including pallet means for mounting each stored object, each pallet being of a size suited for the mounting of the object mounted thereupon, the pallets being adapted for positioning into guides in each magazine.

3. The apparatus of claim 2, in which the pallets are moveable into and out of each compartment in a direction different from the direction in which the manipulator enters and leaves a compartment.

4. The apparatus of claim 2, further including:
    mounting means on the pallet means; and
    edge portions on the mounting means, the edge portions preventing the sliding of an object and supporting each object far enough above the pallet means to permit insertion therebetween of the appropriate gripping arms.

5. The apparatus of claim 4, whereby the mounting means are adjustably fitted to the pallet means.

6. The apparatus of claim 1, wherein the manipulator and the gripping arms have self-centering coupling means, to facilitate alignment and coupling to each other.

7. The apparatus of claim 6, in which the coupling means includes a three point coupling for engagement by the manipulator.

8. The apparatus of claim 7, further including holding means on pallet means for holding the gripping arms in an inclined position, whereby corresponding counterpart members provided on the manipulator engage the three point coupling in response to the lowering of the magazine for the gripping arm to be removed from the pallet means.

9. An automatic handling apparatus for plate shaped objects, comprising:
    -a plurality of vertically stacked storage compartments forming a magazine;
    means in each compartment for the removable storage of plate shaped objects or support arms, different compartments containing differently sized and shaped objects or support arms;
    coding means attached to each compartment to identify the contents therein;
    a manipulator adapted to engage and remove individual support arms;
    actuating means responsive to the code means for rotating the manipulator and moving it toward and away from the magazine;
    means responsive to the code means for raising and lowering the magazine;
    means within each compartment for supporting each plate shaped object so that it may be removed from the compartment by suitably sized support arms; and
    control means responsive to the code means for coordinately positioning the manipulator and the appropriate compartment in order to handle a selected object.

* * * * *